United States Patent

Chan

(10) Patent No.: US 9,368,618 B2
(45) Date of Patent: Jun. 14, 2016

(54) SEMICONDUCTOR STRUCTURE

(71) Applicant: MACRONIX INTERNATIONAL CO., LTD., Hsinchu (TW)

(72) Inventor: Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/485,922

(22) Filed: Sep. 15, 2014

(65) Prior Publication Data

US 2016/0079346 A1  Mar. 17, 2016

(51) Int. Cl.
*H01L 27/12* (2006.01)
*H01L 29/78* (2006.01)
*H01L 29/10* (2006.01)
*H01L 27/02* (2006.01)

(52) U.S. Cl.
CPC ........ *H01L 29/7816* (2013.01); *H01L 29/1083* (2013.01); *H01L 29/7833* (2013.01); *H01L 27/0248* (2013.01); *H01L 27/0251* (2013.01); *H01L 27/0266* (2013.01); *H01L 27/0274* (2013.01); *H01L 27/0277* (2013.01)

(58) Field of Classification Search
CPC ............ H01L 27/0248; H01L 27/0251; H01L 27/0266; H01L 27/0274; H01L 27/0277
USPC .................................. 438/286; 257/355, 350
See application file for complete search history.

(56) References Cited

U.S. PATENT DOCUMENTS

| | | | | |
|---|---|---|---|---|
| 8,338,872 | B2* | 12/2012 | Khemka et al. | 257/299 |
| 2002/0084490 | A1* | 7/2002 | Ker et al. | 257/355 |
| 2002/0123184 | A1* | 9/2002 | Li | H01L 21/761 438/199 |
| 2005/0194647 | A1* | 9/2005 | Tsai et al. | 257/377 |
| 2008/0014687 | A1* | 1/2008 | Vora | H01L 29/66901 438/186 |
| 2010/0052052 | A1* | 3/2010 | Lotfi | H01L 21/28518 257/336 |
| 2014/0284720 | A1* | 9/2014 | Chen et al. | 257/355 |

* cited by examiner

*Primary Examiner* — Kimberly Rizkallah
*Assistant Examiner* — Maria Ligai
(74) *Attorney, Agent, or Firm* — McClure, Qualey & Rodack, LLP

(57) ABSTRACT

A semiconductor structure comprising an improved ESD protection device is provided. The semiconductor structure comprises a substrate, a well formed in the substrate, a first heavily doped region formed in the well, a second heavily doped region formed in the well and separated apart from the first heavily doped region, a gate structure formed on the substrate between the first heavily doped region and the second heavily doped region, a field region formed in the well under the first heavily doped region and the gate structure, and a field oxide/shallow trench isolation structure formed adjacent to the first heavily doped region. The field region is not formed under the second heavily doped region. The well and the field region have a first type of doping. The first heavily doped region and the second heavily doped region have a second type of doping.

15 Claims, 6 Drawing Sheets

US 9,368,618 B2

SEMICONDUCTOR STRUCTURE

BACKGROUND

1. Technical Field

The disclosure relates to a semiconductor structure. More particularly, the disclosure relates to a semiconductor structure comprising an electrostatic discharge (ESD) protection device.

2. Description of the Related Art

Electrostatic discharge (ESD) may cause damage to sensitive electronic devices. As such, ESD protection devices are typically provided in the semiconductor structures. Metal-oxide-semiconductor field-effect transistor (MOSFET), extended drain MOSFET (EDMOSFET), lateral double-diffused MOSFET (LDMOSFET), devices applying the reduced surface field (RESURF) technique, and the like, may be used as the ESD protection devices. The research and improvement of the ESD protection devices have been conducted to this day.

SUMMARY

In this disclosure, a semiconductor structure which comprises an improved ESD protection device is provided.

According to some embodiment, the semiconductor structure comprises a substrate, a well, a first heavily doped region, a second heavily doped region, a gate structure, a field region and a field oxide. The well is formed in the substrate. The well has a first type of doping. The first heavily doped region is formed in the well. The first heavily doped region has a second type of doping. The second heavily doped region is formed in the well and separated apart from the first heavily doped region. The second heavily doped region has the second type of doping. The gate structure is formed on the substrate between the first heavily doped region and the second heavily doped region. The field region is formed in the well under the first heavily doped region and the gate structure. The field region is not formed under the second heavily doped region. The field region has the first type of doping. The field oxide is formed adjacent to the first heavily doped region.

According to some embodiment, the semiconductor structure comprises a substrate, a well, a first heavily doped region, a second heavily doped region, a gate structure, a field region and a shallow trench isolation structure. The well is formed in the substrate. The well has a first type of doping. The first heavily doped region is formed in the well. The first heavily doped region has a second type of doping. The second heavily doped region is formed in the well and separated apart from the first heavily doped region. The second heavily doped region has the second type of doping. The gate structure is formed on the substrate between the first heavily doped region and the second heavily doped region. The field region is formed in the well under the first heavily doped region and the gate structure. The field region is not formed under the second heavily doped region. The field region has the first type of doping. The shallow trench isolation structure is formed adjacent to the first heavily doped region.

Figure 1A:
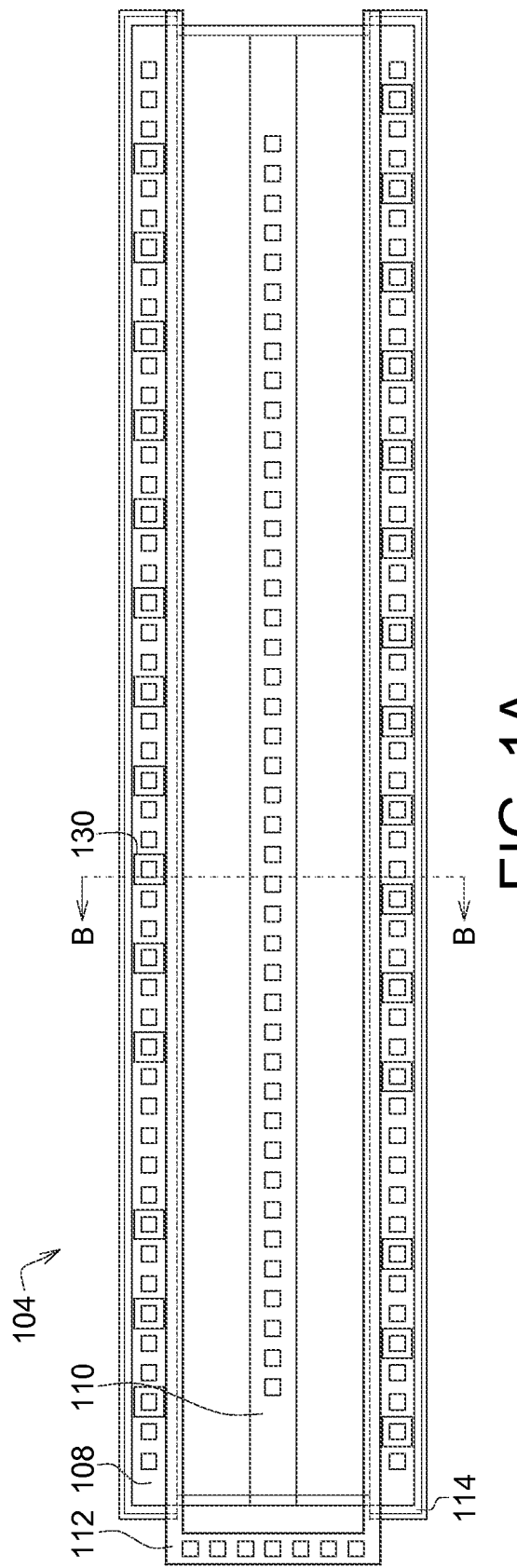
FIGS. 1A-1B schematically show a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to the semiconductor structure comprising the ESD protection device. For clarity, some element may be omitted from the drawings. Identical elements will be indicated by identical reference numerals, while possible.

Figure 1B:
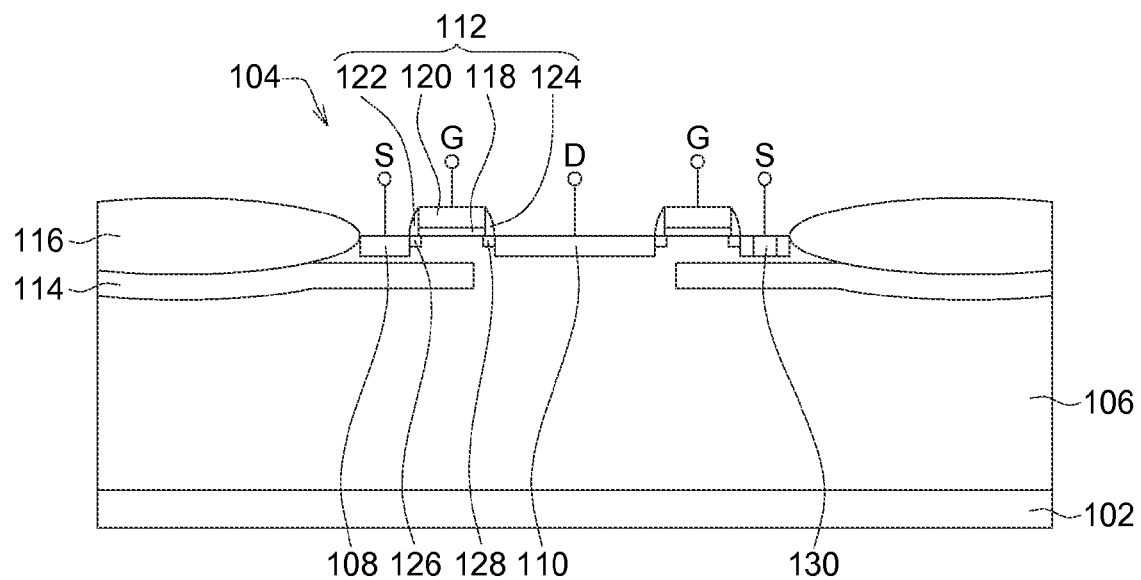

Referring to FIGS. 1A-1B, a semiconductor structure according to one embodiment is illustrated. FIG. 1A shows a top view of the semiconductor structure, and FIG. 1B shows a cross-sectional view of the semiconductor structure taken from the cross-sectional line B-B in FIG. 1A.

The semiconductor structure comprises a substrate 102 and an ESD protection device 104. The substrate 102 may be a silicon substrate, a silicon on insulator (SOI) substrate or the like. The ESD protection device 104 is exemplarily illustrated to have the MOSFET configuration in this embodiment. However, the ESD protection device 104 may have another configuration. The ESD protection device 104 comprises a well 106, a first heavily doped region 108, a second heavily doped region 110, a gate structure 112 and a field region 114. The well 106 is formed in the substrate 102. The well 106 has a first type of doping. The first heavily doped region 108 is formed in the well 106. The first heavily doped region 108 has a second type of doping. The second heavily doped region 110 is formed in the well 106 and separated apart from the first heavily doped region 108. The second heavily doped region 110 has the second type of doping. The first heavily doped region 108 may be a source region, and the second heavily doped region 110 may be a drain region. The gate structure 112 is formed on the substrate 102 between the first heavily doped region 108 and the second heavily doped region 110. More specifically, the gate structure 112 comprises a gate dielectric 118, a gate electrode 120 and two spacers 122 and 124, wherein the gate dielectric 118 is formed on the substrate 102, the gate electrode 120 is formed on the gate dielectric 118, and the two spacers 122 and 124 are formed on two sides of the gate electrode 120, respectively. The field region 114 is formed in the well 106 under the first heavily doped region 108 and the gate structure 112. The field region 114 is not formed under the second heavily doped region 110 so as to improve voltage endurance. The field region 114 has the first type of doping. The semiconductor structure further comprises a field oxide 116. The field oxide 116 is formed adjacent to the first heavily doped region 108. In this embodiment, the field region 114 may further extend under the field oxide 116. In this embodiment, the first type of doping may be p-type, and the second type of doping may be n-type. In an alternative embodiment, the first type of doping may be n-type, and the second type of doping may be p-type.

The ESD protection device 104 may further comprise two lightly doped regions 126 and 128. One is formed in the well 106 adjacent to the first heavily doped region 108, and the another one is formed in the well 106 adjacent to the second heavily doped region 110. The lightly doped regions 126 and 128 have the second type of doping. The lightly doped region 128 near the drain region (in this embodiment, the second heavily doped region 110) has a function of reducing the hot carrier effect so as to protect the drain region.

The ESD protection device 104 may further comprise a third heavily doped region 130. The third heavily doped region 130 is formed in the first heavily doped region 108. The third heavily doped region 130 has the first type of doping. Such disposition constitutes a parasitic bipolar junction transistor (BJT) which improves the ESD protection performance.

In the formation of the semiconductor structure according to this embodiment, first, the well 106 is implanted into the substrate 102. The source region and the drain region, i.e., the first heavily doped region 108 and the second heavily doped region 110, then are formed in the well 106. The field region 114 is implanted into the well 106. Thereafter, the field oxide 116 is formed. The gate dielectric 118 and the gate electrode 120 are formed sequentially. Then, the lightly doped regions 126 and 128 are implanted into the well 106. Thereafter, the spacers 122 and 124 are formed on the two sides of the gate electrode 120. The third heavily doped region 130 is formed in the first heavily doped region 108. After that, contacts and other structure may be formed.

Figure 2A:
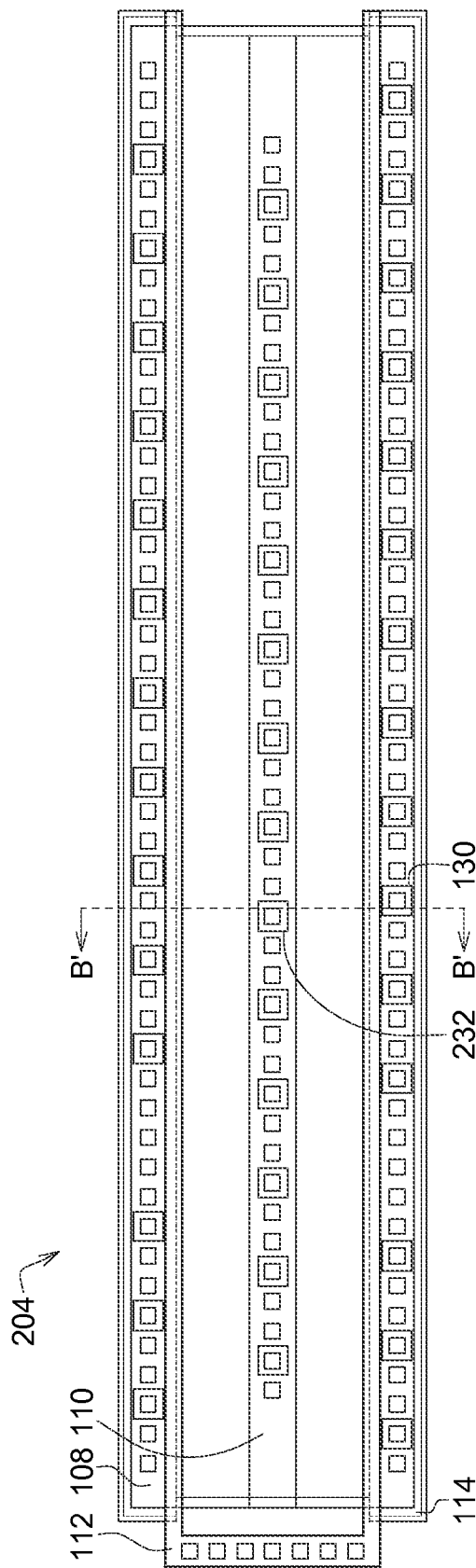
FIGS. 2A-2B schematically show a semiconductor structure according to one embodiment.
Figure 2B:
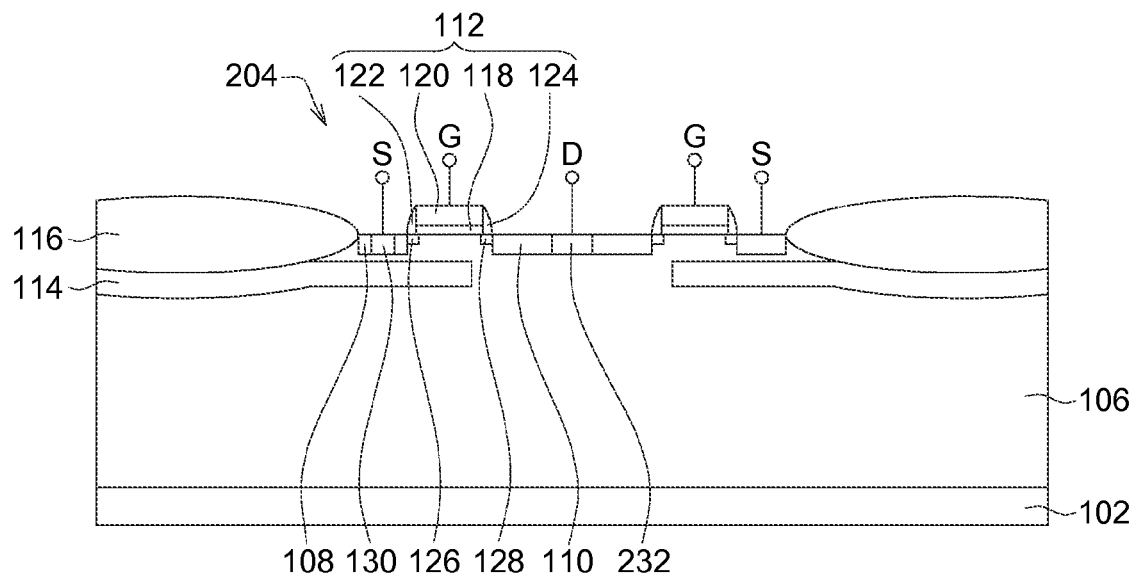

Referring to FIGS. 2A-2B, a semiconductor structure according to another embodiment is illustrated. FIG. 2A shows a top view of the semiconductor structure, and FIG. 2B shows a cross-sectional view of the semiconductor structure taken from the cross-sectional line B'-B' in FIG. 2A. In this embodiment, the ESD protection device 204 comprises a fourth heavily doped region 232. The fourth heavily doped region 232 is formed in the second heavily doped region 110. The third heavily doped region 130 and the fourth heavily doped region 232 may be formed alternately, as shown in FIG. 2A. The fourth heavily doped region 232 has the first type of doping. Similar to the third heavily doped region 130, the disposition of the fourth heavily doped region 232 can improve the ESD protection performance.

Figure 3:
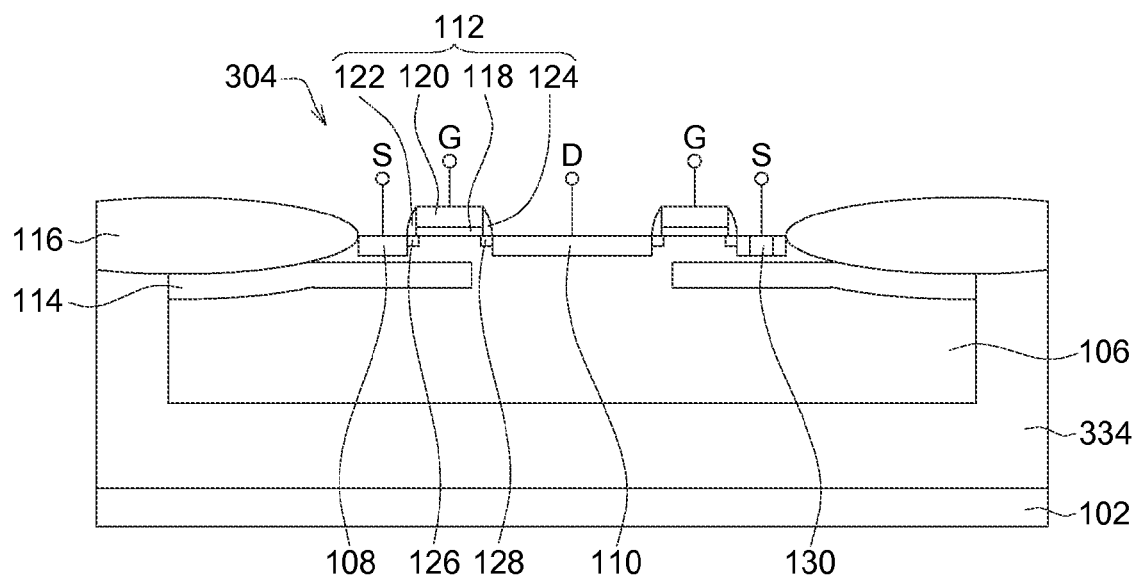
FIG. 3 schematically shows a semiconductor structure according to one embodiment.

Referring to FIG. 3, a semiconductor structure according to still another embodiment is illustrated. In this embodiment, the semiconductor structure further comprises a deep well 334 provided for isolation. The deep well 334 is formed in the substrate 102, and the well 106 is formed in the deep well 334. The field region 114 of the ESD protection device 304 does not extend to the deep well 334. The deep well 334 has the second type of doping.

Figure 4:
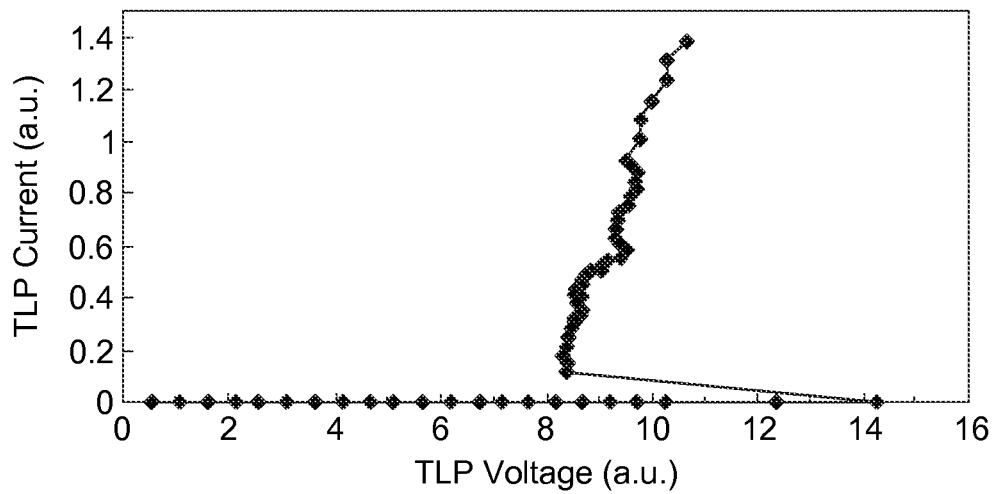
FIG. 4 shows characteristics of a semiconductor structure of one example of the disclosure.
Figure 5:
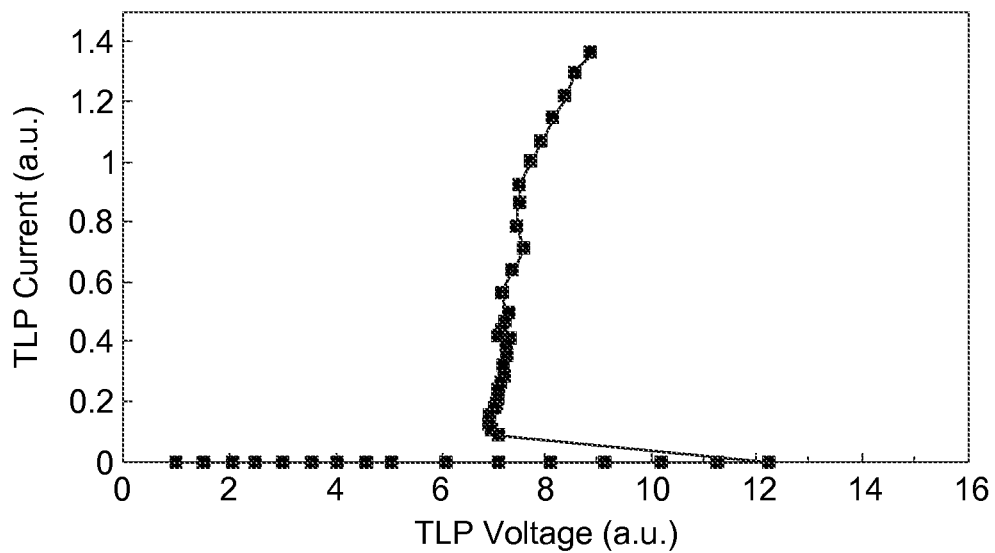
FIG. 5 shows characteristics of a semiconductor structure of a comparative example.

FIG. 4 shows characteristics of a semiconductor structure of one example of the disclosure, and FIG. 5 shows characteristics of a semiconductor structure of a comparative example. The semiconductor structure of the example and the semiconductor structure of the comparative example have the same total width and the same gate electrode to drain side contact rule. Compared to the semiconductor structure of the comparative example, the holding voltage of the semiconductor structure of the example increases about 20%, and the trigger voltage of the semiconductor structure of the example increases about 17%. The increase of the holding voltage is beneficial for reducing the effect of latch-up. The increase of the trigger voltage means that the semiconductor structure of the example is more robust.

Figure 6:
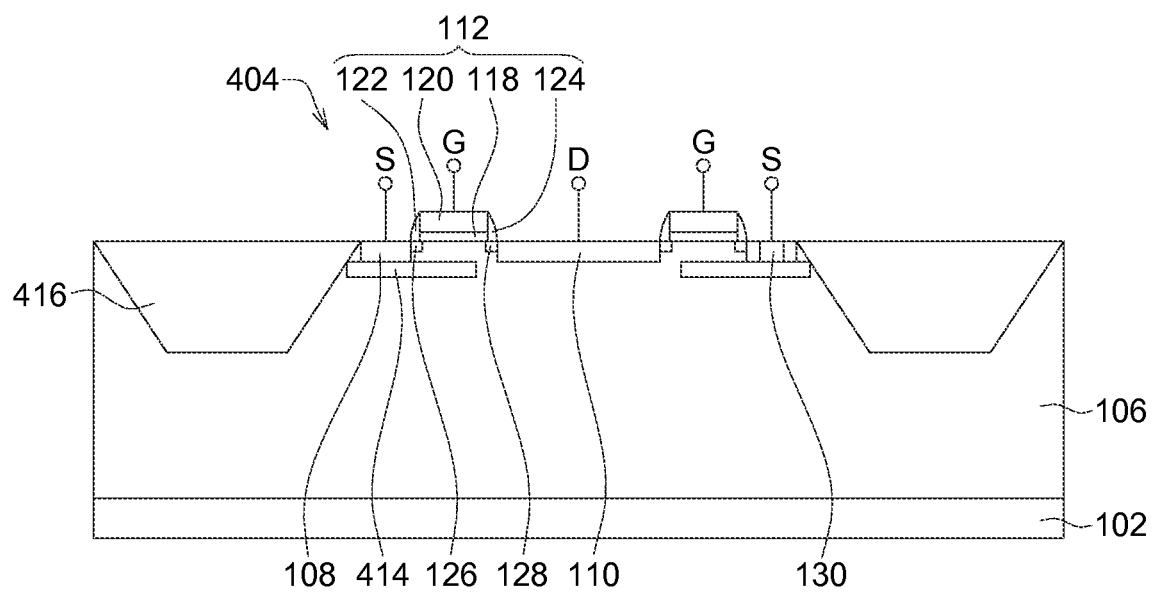
FIG. 6 schematically shows a semiconductor structure according to one embodiment.

Now referring to FIG. 6, a semiconductor structure according to another embodiment is illustrated. The semiconductor structure comprises a substrate 102 and an ESD protection device 404. The ESD protection device 404 is exemplarily illustrated to have the MOSFET configuration in this embodiment. However, the ESD protection device 404 may have another configuration. The ESD protection device 404 comprises a well 106, a first heavily doped region 108, a second heavily doped region 110, a gate structure 112 and a field region 414. The well 106, the first heavily doped region 108, the second heavily doped region 110 and the gate structure 112 of the ESD protection device 404 are the same as those of the ESD protection device 104, and the illustration is omitted herein. The field region 414 is formed in the well 106 under the first heavily doped region 108 and the gate structure 112. The field region 414 is not formed under the second heavily doped region 110 so as to improve voltage endurance. The field region 414 has the first type of doping. The semiconductor structure further comprises a shallow trench isolation (STI) structure 416. The STI structure 416 is formed adjacent to the first heavily doped region 108. In this embodiment, the field region 414 does not extend under the STI structure 416. In this embodiment, the first type of doping may be p-type, and the second type of doping may be n-type. In an alternative embodiment, the first type of doping may be n-type, and the second type of doping may be p-type.

Similar to the ESD protection device 104, the ESD protection device 404 may further comprise two lightly doped regions 126 and 128, and/or a third heavily doped region 130. The semiconductor structure according to this embodiment may further comprise a fourth heavily doped region as shown in FIG. 2. The semiconductor structure according to this embodiment may further comprise a deep well as shown in FIG. 3.

In the formation of the semiconductor structure according to this embodiment, first, the STI structure 416 is formed in the substrate 102. Then, the well 106 is implanted into the substrate 102. Thereafter, the source region and the drain region, i.e., the first heavily doped region 108 and the second heavily doped region 110, are formed in the well 106. The field region 414 is implanted into the well 106. Then, the gate dielectric 118 and the gate electrode 120 are formed sequentially. The lightly doped regions 126 and 128 are implanted into the well 106. Thereafter, the spacers 122 and 124 are formed on the two sides of the gate electrode 120. The third heavily doped region 130 is formed in the first heavily doped region 108. After that, contacts and other structure may be formed.

Since the field region is not formed under the second heavily doped region, the punch-through between the source region and the drain region is prevented in the semiconductor structure according to the embodiments. As such, the voltage endurance of the semiconductor structure according to the embodiment can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A semiconductor structure, comprising:
   a substrate;
   a well formed in the substrate, the well having a first type of doping;
   a first heavily doped region formed in the well, the first heavily doped region having a second type of doping;

a second heavily doped region formed in the well and separated apart from the first heavily doped region, the second heavily doped region having the second type of doping;

a lightly doped region formed in the well adjacent to the second heavily doped region, the lightly doped region having the second type of doping;

a gate structure formed on the substrate between the first heavily doped region and the second heavily doped region;

a field region formed in the well under the first heavily doped region and the gate structure, the field region having the first type of doping, wherein the field region is not formed under the second heavily doped region and the lightly doped region adjacent to the second heavily doped region; and a field oxide formed adjacent to the first heavily doped region;

wherein the first heavily doped region and the second heavily doped region are directly formed in the well, and wherein the first heavily doped region and the second heavily doped region directly contact the well.

2. The semiconductor structure according to claim 1, wherein the field region further extends under the field oxide.

3. The semiconductor structure according to claim 1, wherein the gate structure comprises:
a gate dielectric formed on the substrate;
a gate electrode formed on the gate dielectric; and
two spacers formed on two sides of the gate electrode, respectively.

4. The semiconductor structure according to claim 1, further comprising:
a third heavily doped region formed in the first heavily doped region, the third heavily doped region having the first type of doping.

5. The semiconductor structure according to claim 1, further comprising:
a fourth heavily doped region formed in the second heavily doped region, the fourth heavily doped region having the first type of doping.

6. The semiconductor structure according to claim 1, further comprising:
a deep well formed in the substrate, the deep well having the second type of doping, wherein the well is formed in the deep well.

7. The semiconductor structure according to claim 1, wherein the first type of doping is p-type, and the second type of doping is n-type.

8. The semiconductor structure according to claim 1, further comprising:
an electrostatic discharge (ESD) protection device comprising the well, the first heavily doped region, the second heavily doped region, the gate structure and the field region.

9. A semiconductor structure, comprising:
a substrate;
a well formed in the substrate, the well having a first type of doping;
a first heavily doped region formed in the well, the first heavily doped region having a second type of doping;
a second heavily doped region formed in the well and separated apart from the first heavily doped region, the second heavily doped region having the second type of doping;
a lightly doped region formed in the well adjacent to the second heavily doped region, the lightly doped region having the second type of doping;
a gate structure formed on the substrate between the first heavily doped region and the second heavily doped region;
a field region formed in the well under the first heavily doped region and the gate structure, the field region having the first type of doping, wherein the field region is not formed under the second heavily doped region and the lightly doped region adjacent to the second heavily doped region; and
a shallow trench isolation structure formed adjacent to the first heavily doped region;
wherein the first heavily doped region and the second heavily doped region are directly formed in the well, and wherein the first heavily doped region and the second heavily doped region directly contact the well.

10. The semiconductor structure according to claim 9, wherein the gate structure comprises:
a gate dielectric formed on the substrate;
a gate electrode formed on the gate dielectric; and
two spacers formed on two sides of the gate electrode, respectively.

11. The semiconductor structure according to claim 9, further comprising:
a third heavily doped region formed in the first heavily doped region, the third heavily doped region having the first type of doping.

12. The semiconductor structure according to claim 9, further comprising:
a fourth heavily doped region formed in the second heavily doped region, the fourth heavily doped region having the first type of doping.

13. The semiconductor structure according to claim 9, further comprising:
a deep well formed in the substrate, the deep well having the second type of doping, wherein the well is formed in the deep well.

14. The semiconductor structure according to claim 9, wherein the first type of doping is p-type, and the second type of doping is n-type.

15. The semiconductor structure according to claim 9, further comprising:
an electrostatic discharge (ESD) protection device comprising the well, the first heavily doped region, the second heavily doped region, the gate structure and the field region.

* * * * *